United States Patent [19]

Lese et al.

[11] Patent Number: 4,461,013

[45] Date of Patent: Jul. 17, 1984

[54] FREQUENCY MODULATION TRANSMITTER FOR VOICE OR DATA

[75] Inventors: Gregory Lese, Howell; Donald H. Nash, Colts Neck, both of N.J.

[73] Assignee: AT&T Bell Laboratories, Murray Hill, N.J.

[21] Appl. No.: 447,019

[22] Filed: Dec. 6, 1982

Related U.S. Application Data

[62] Division of Ser. No. 251,258, Apr. 6, 1981.

[51] Int. Cl.³ .............................................. H03C 3/00
[52] U.S. Cl. ................................... 375/65; 332/16 R; 332/20; 332/29 R
[58] Field of Search ..................... 375/62, 65; 455/608, 455/614, 615, 618; 340/636; 320/48; 331/179, 51; 332/16 R, 20, 29 R, 10, 9 R; 377/44, 52

[56] References Cited

U.S. PATENT DOCUMENTS 3,761,625 9/1973 Bruene .................................. 375/62
4,232,308 11/1980 Lee et al. ......................... 340/636 X Primary Examiner—Robert L. Griffin
Assistant Examiner—Albert W. Watkins
Attorney, Agent, or Firm—S. R. Williamson

[57] ABSTRACT

A portable frequency modulation transmitter (1) for voice or data is disclosed for operation at infrared frequencies. The transmitter comprises keyboard (200) or microphone (402) input capability and dual modes of use. In the data mode, carrier is generated when the keyboard is operated and is not generated when the keyboard is idle in order to conserve power. In the voice mode, either voice or data may be transmitted, data having priority over voice. A series connection of two variable modulus counters (302, 303) and other counters (304, 305, 306) provide a frequency shift keyed data signal, marker data signal, marker data frames between data frames, parity insertion and other features. In the event that the local battery power level falls below a particular level, a particular word is inserted in the applied binary data input.

9 Claims, 10 Drawing Figures

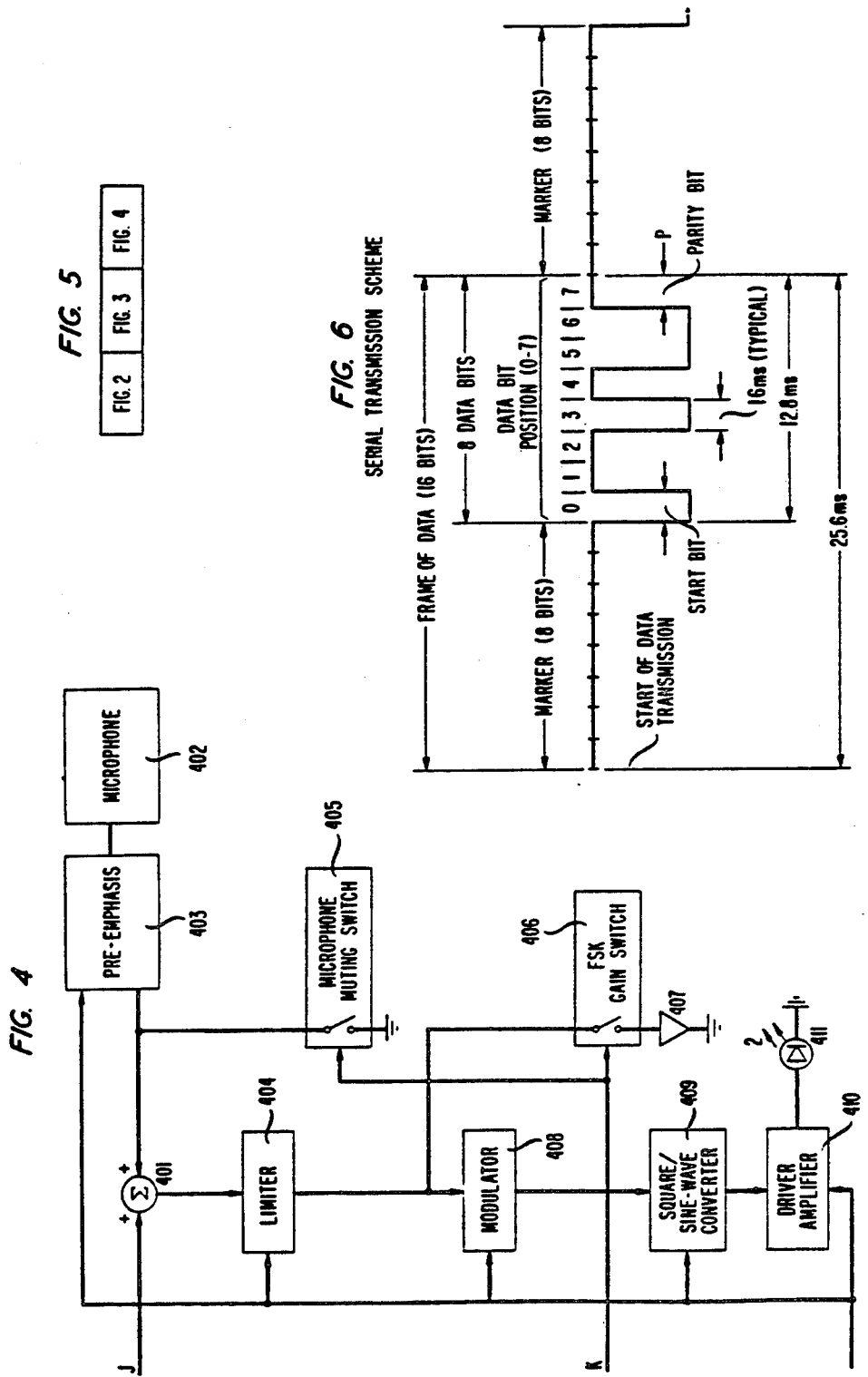

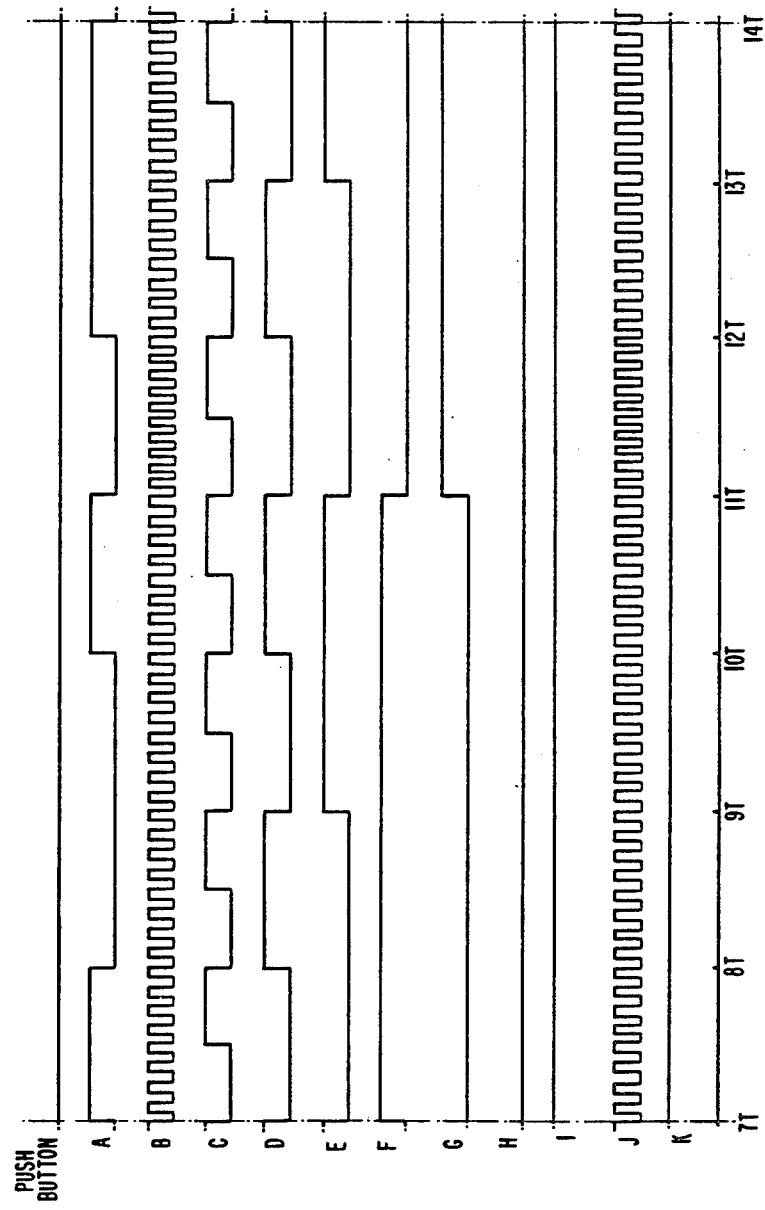

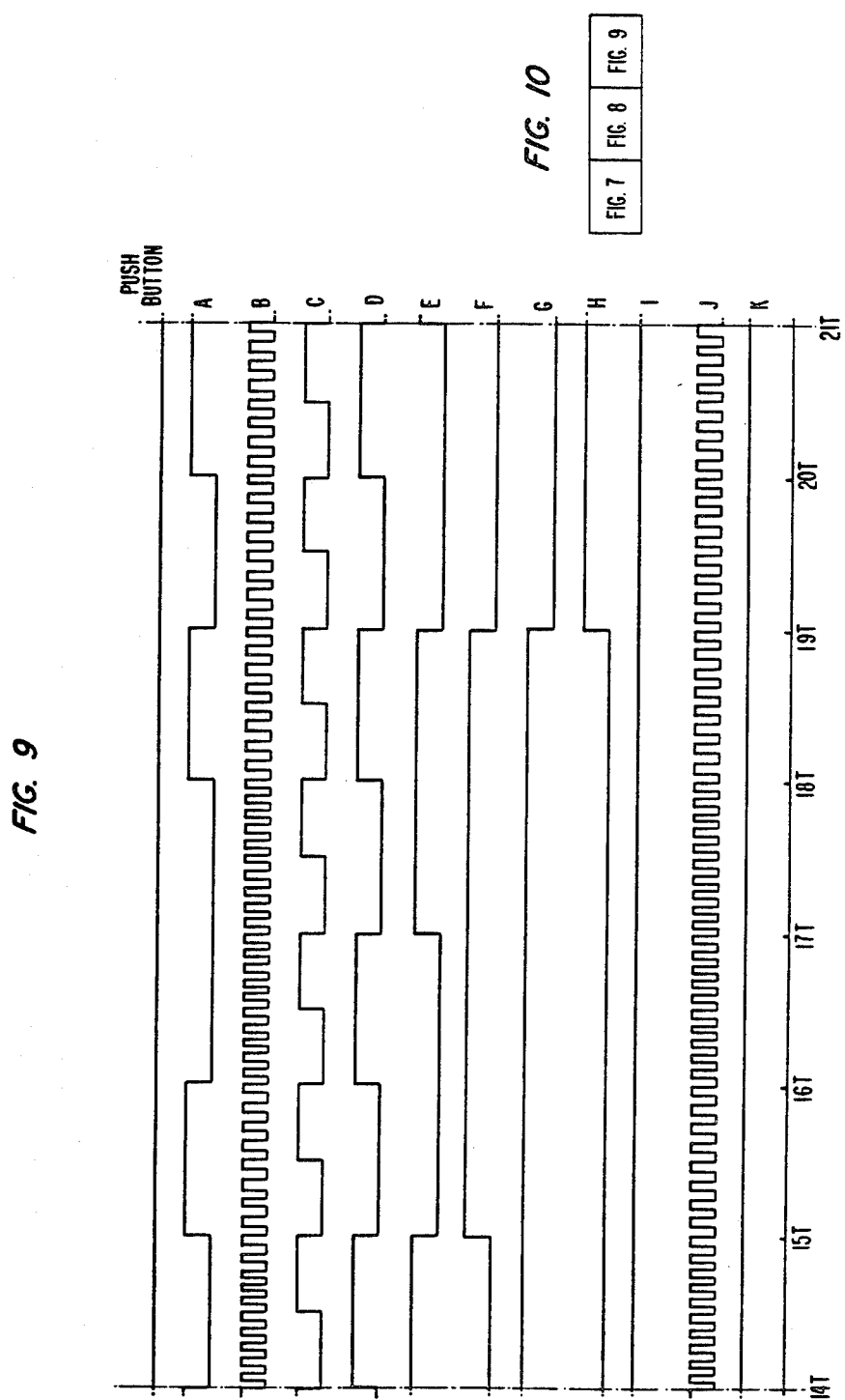

FREQUENCY MODULATION TRANSMITTER FOR VOICE OR DATA

This is a division of application Ser. No. 251,258, filed Apr. 6, 1981.

BACKGROUND OF THE INVENTION

1. Technical Field

This invention relates to portable frequency modulation transmission systems and, more particularly, to providing dual modes of use in such systems.

2. Description of the Prior Art

Cordless telephone station systems employing infrared transmission are known comprising a portable cordless transmitter with remote microphone and supervisory signaling capabilities. One such transmitter is described in Anglikowski et al., U.S. Pat. No. 4,221,932. The supervisory signaling is achieved by shifting the carrier frequency of the transmitted signal for indicating a low battery condition and transmitter turnoff. There is no keyboard data input capability.

Alternatively, portable cordless transmitters are known for transmitting keyboard entered data signals for controlling a cathode ray tube television terminal. For example, Richter et al., U.S. Pat. No. 4,091,272, discloses an infrared remote controlled command system for operating a television receiver. Keys of a keyboard are provided for selecting the television channel or for controlling the volume level.

With the onset of viewdata services wherein a combination telephone and television terminal may be provided to telephone subscribers, it is believed desirable that both voice and data be enterable from the remote portable transmitter. The user of the transmitter would not have to be located in close proximity to the viewdata terminal and would be able to remotely control its television and telephone functions.

SUMMARY OF THE INVENTION

The above-stated problems and related problems of the prior art are solved with the principles of the present invention, a frequency modulation transmitter for voice and data. The transmitter comprises remote keyboard and microphone capability and dual modes of use. In the data mode of use, carrier frequency is only generated when the keyboard characters are depressed in order to conserve battery power. In the voice mode of use, either voice or data may be transmitted, the data preempting the voice. Carrier frequency is continuously generated in this mode. A carrier control circuit responsive to the selection of voice or data mode provides this carrier control feature.

In the voice mode of use, a data control signal indicative of the presence of data is provided. The data control signal controls the operation of a microphone muting switch and a frequency shift key gain switch. If data is present, the microphone is muted and, as a result, the data preempts the voice signal.

Space is another primary consideration in the design of a small portable transmitter. Accordingly, the transmitter comprises a minimum number of components providing a maximum number of features. The primary components of the present transmitter for providing a modulated data signal are two variable modulus counters. The first counter divides a clock frequency either by one or another particular modulus, its input being a binary bit data stream. The second variable modulus counter, responsive to the binary bit stream divides the output of the first counter by the same moduli oppositely. In this manner, an output signal is provided at the input bit stream rate. This bit rate output, then, may be used to provide a number of features after passage through a number of particularized counters.

For example, a data bit counter counts the generated data bits. In combination with a data selector circuit for providing the binary data stream to the counters, the data can be separated into words of a particular length. Another particularized counter, a marker/data counter, inhibits the flow of data for the insertion of marker data before each data word. A frame counter provides information to an on/off control circuit for sending a particular number of frames of information to the receiver indicating that the transmitter has just been turned on or off.

BRIEF DESCRIPTION OF THE DRAWINGS

FIGS. 2, 3, and 4 are schematic drawings and general block diagrams of one embodiment of the present frequency modulation transmitter for voice or data;

FIG. 5 is a key figure, demonstrating the relationships among FIGS. 2, 3, and 4;

FIG. 6 is a graphical representation of one serial transmission scheme which may be employed in the present invention;

FIGS. 7, 8, and 9 are timing diagrams, illustrating the operation of FIGS. 2, 3, and 4 and portraying waveforms at various points in the transmitter circuit over a duration of 21 time periods; and FIG. 10 is a key figure, demonstrating the relationships among FIGS. 7, 8, and 9.

DETAILED DESCRIPTION

Figure 1:
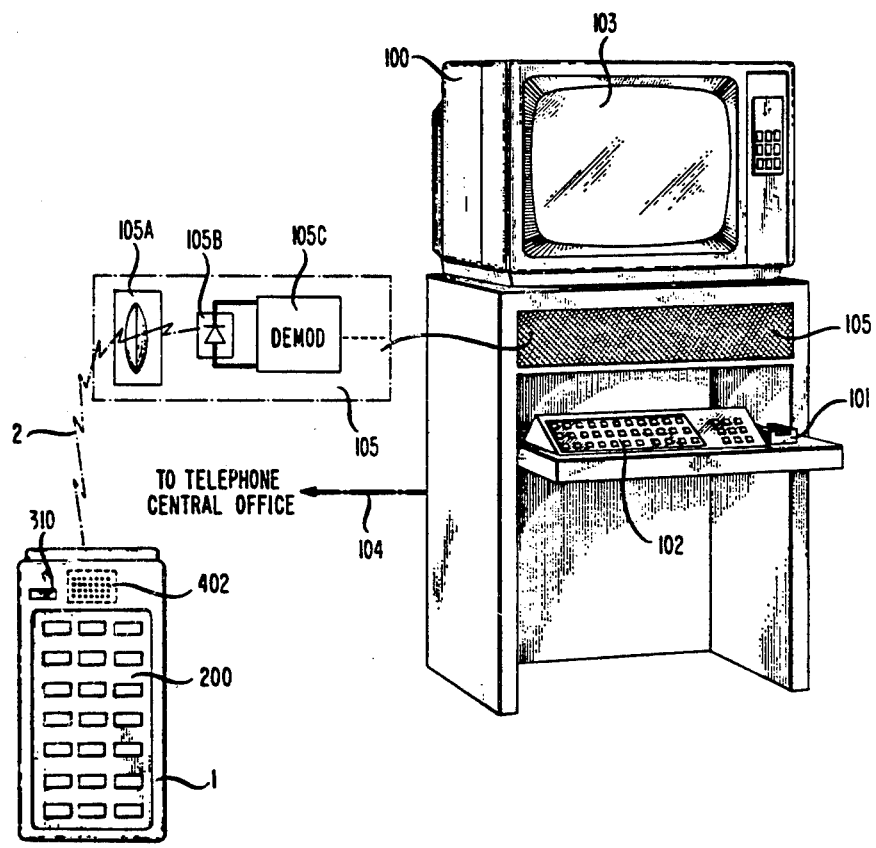
FIG. 1 is a schematic drawing and pictorial representation of a viewdata services terminal comprising the present frequency modulation transmitter for voice or data.

Referring more particularly to FIG. 1, there is shown a schematic drawing and pictorial representation of a terminal for providing viewdata services comprising a transmitter 1 in accordance with the present invention. The transmitter 1 is portable and adapted to be handheld. It comprises an on/off slide switch 310, a microphone 402 and a keyboard 200. The transmitter also comprises integrated injection logic and infrared transmission circuitry (not shown), the logic circuits assisting greatly in reducing the size and complexity of the data modulation circuits that would have otherwise been required. While the particular depicted transmitter operates at infrared frequencies, any medium for carrying a frequency modulated signal may be employed including sound waves, light waves or radio waves.

The receiver portion of the viewdata terminal comprises a charging stand 101 for the portable transmitter, a keyboard 102, a frequency modulation receiver and terminal control unit 105, and a television 100. The television 100 may alternatively receive television channels or frames of data information received over a telephone cable pair 104 connecting the viewdata terminal with a telephone central office. Both types of information are selectably viewable on display screen 103 of television 100.

When the terminal is employed for viewdata services, the user of transmitter 1 operates on/off switch 310. A sequence of data indicating that the transmitter has been turned on is transmitted over infrared lightwaves 2 to receiver and terminal control unit 105.

One frequency modulation receiver which may be employed with the present transmitter 1 is disclosed in U.S. Pat. No. 4,388,730 by D. H. Nash and D. H. Yen entitled, "Noise Detector and Data Signal Receiver for a Frequency Modulation System." If lightwaves are employed, receiver 105 is assumed to comprise a lens system 105A for focusing direct and reflected lightwaves upon a photo transducer circuit 105B. The resultant electrical carrier frequency is then demodulated by a demodulator circuit 105C.

The transmitter 1 having transmitted a sequence of data codes signifying an "on" condition, is now automatically placed in one of two operating modes, voice or data. In one particular embodiment, the data mode is entered first because, as it will be subsequently demonstrated, the data mode is a power-saving mode. Also, from a human factors standpoint, it is believed more likely that the terminal operator will be inputting command data information to the terminal at this time.

In the data mode, the user may depress any one of the keyboard buttons or switch the transmitter off. Upon depressing a button, it will be subsequently described in great detail that the user transmits a sequence of frames of data relating to the button depressed either until a particular number of frames is transmitted or the button is released. Responsive to the receipt of the data, the viewdata receive terminal typically displays the data on the screen 103 and performs the command entered.

The depicted keyboard 200 portrays 21 buttons or activatable commands. It may be implied therefrom that the number of possible commands is limited in comparison with keyboard 102 associated with the viewdata terminal. In actuality, the remote command capability is only limited by the practicalities of the hand-held unit. The limited keyboard size, for example, may be overcome by providing for upper and lower case (shift) operation, a diminishment of button size, or other means known in the art. The amount of transmitted data may be doubled by increasing the length of a data word by one bit. Accordingly, the subsequently described principles of the present invention may be employed regardless of the characteristics of the keyboard chosen.

Referring more particularly to key FIG. 5 and FIGS. 2, 3, and 4, a schematic drawing and block diagram of a transmitter in accordance with the present invention is shown. To show the interrelationships among FIGS. 2, 3 and 4, it is necessary to juxtaposition them in accordance with FIG. 5. Similar reference characters are used wherever possible to denote similar components already identified in FIG. 1. In addition, the first numeral of the reference characters employed in FIGS. 2, 3, and 4 refers to the number of the figure in which the item referred to is located.

Figure 2:
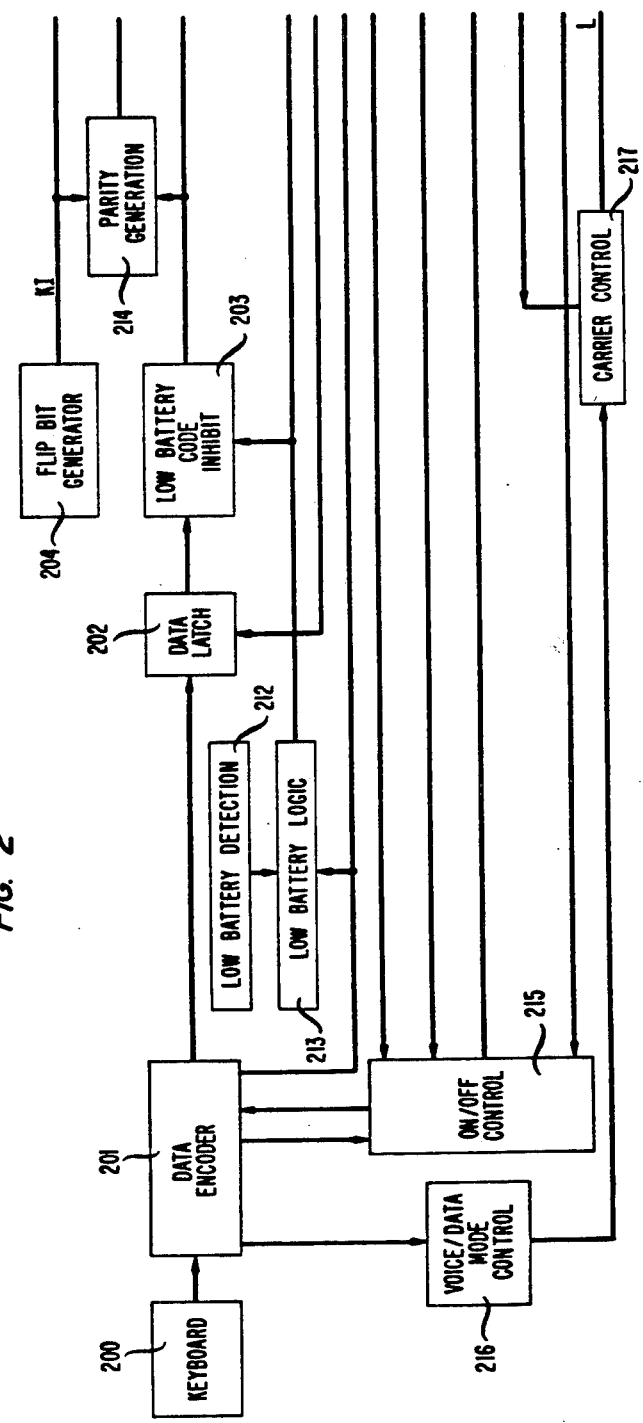
Figure 3:
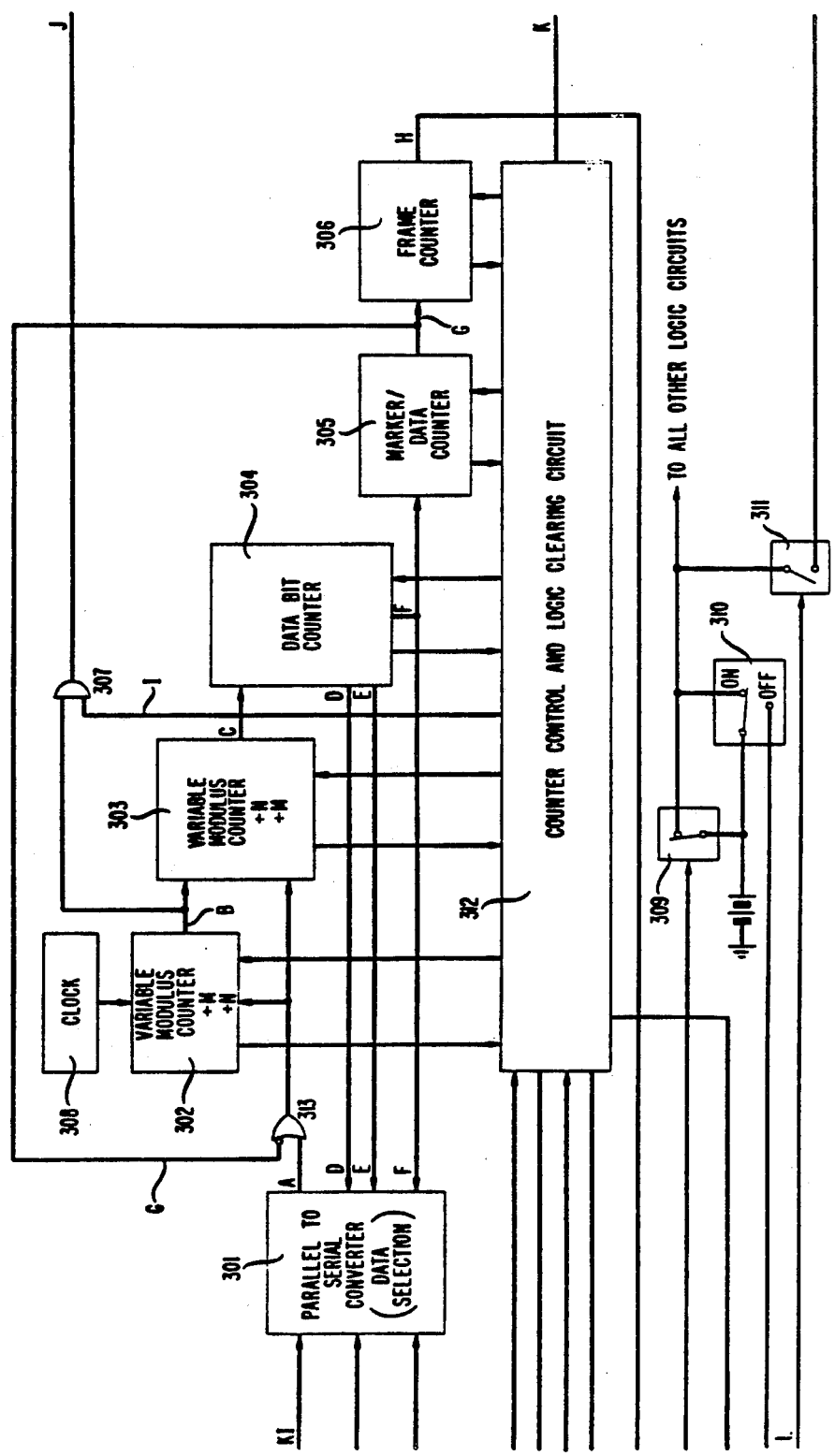

In FIG. 3, there is shown on/off switch 310 which may be a two position slide switch as is depicted in FIG. 1. There is also depicted a keep-on switch 309. These are connected to a source battery for the transmitter and are shown in their "on" state. Initially switch 309 is open and switch 310 is in the "off" position. When switch 310 is turned on, a resistor and capacitor circuit (not shown) connected across the battery supply is activated which enables the on/off control circuit 215, in FIG. 2, to close keep-on switch 309. In this manner, power is provided to all logic circuits on a continuous basis.

Referring now to FIG. 2, the activated on/off control circuit 215 provides a particular number of data words indicating that the transmitter has been turned on to the data encoder circuit 201. The data is provided in parallel format to data latch circuit 202 where it is temporarily stored. Simultaneously, the data encoder circuit activates voice/data mode control circuit 216, which comprises memory indicating in which mode the transmitter is currently operating.

As previously discussed, the data mode is automatically assumed upon turn on. If it is desired to power up initially in the voice mode, the voice/data mode control circuit 216 may be so optioned. To change from the initial data mode to voice or vice versa, one keyboard button may be set aside for this purpose, the information being simultaneously stored in voice/data mode control circuit 216 and transmitted to the receive terminal.

If the terminal is in the data mode, carrier control circuit 217 provides carrier control signal L to close switch 311 only if data is present. Switch 311 provides power to carrier modulator and transmission circuitry 404, 408, 409 and 410 and voice preemphasis circuit 403. As a result, carrier is only provided when data is present for transmission in the data mode.

Alternatively, if the terminal is in the voice mode, the carrier control circuit 217 provides carrier control signal L to maintain switch 311 in a closed position so long as the transmitter is in the voice mode. As battery power is continuously provided to the carrier modulator and transmission circuitry 408, 409, and 410, carrier is continuously transmitted in the voice mode.

To ensure that the receiver is prepared and recognizes the "on" condition of the transmitter, the code word indicating an "on" condition is transmitted a particular number of times. Control signal H, indicating the number of transmittals, is provided by frame counter 306 to on/off control circuit 215. The operation of the frame counter 306 will be discussed in greater detail in the subsequent discussion of FIG. 3.

Similarly, when the transmitter is turned off, a particular number of codes indicating an "off" condition is transmitted as follows. The user returns slide switch 310 to the "off" position. Control circuit 215 provides "off" codes continuously to data encoder 201 while switches 309 and 311 are maintained closed. When frame counter 306 provides indicator signal H that the particular number of codes is reached, on/off control circuit 215 opens keep-on switch 309. Power is then cut off to all circuitry and carrier transmission ceases.

Low battery detection circuit 212 operates as follows. Immediately after the transmitter is turned on, or after the transmitter has been in prolonged operation, the battery power reserve may fall below a particular acceptable level. In this event, the low battery detection circuit provides an indication to low battery logic circuit 213. In the event that the transmitter has been just turned on or is idle, no data is being entered through keyboard 200. Accordingly, the low battery logic circuit 213 disables the low battery code inhibit circuit 203, generates a unique low battery code, and causes its insertion in the data bit stream for transmission. Alternatively, if data is being provided by data encoder circuit 201, the low battery logic circuit 213 enables the low battery code inhibit circuit 203 for inhibiting the transmission of the low battery code until the data has been transmitted. Upon receiving the low battery code transmission, the receive terminal is able to provide an audible or visual warning to the user of a low battery condition. The user is thereby encouraged to recharge or replace the transmitter's batteries or operate the transmitter in its charging stand.

The KI signal provided by flip bit generator 204 is a locally generated signal intended to assist the terminal in recognizing breaks in data transmission. More a problem in infrared or ultrasonic than with radio transmission, transmission can be broken by inadvertently covering the transmitting means. In the present invention, a particular bit position of the transmitted data word is provided initially in a predetermined state and reversed or flipped in the next transmission of that word. Accordingly, at least two words are always transmitted. In the event of two intentional transmissions of the same data as when the user intentionally wishes to send two transmissions of the same character, the receive terminal is more likely to distinguish this event from a break in transmission. And, in the same manner, the receiver may not interpret an accidental momentary break in transmission as two deliberate character transmissions.

In one embodiment of transmitter 1, a five bit data word is provided by data encoder 201. Thirty-two possible code words comprise the twenty-one keyboard characters, the "on" and "off" codes, and the low battery code. Of course, if more keyboard capability is required, the data encoder capability must be increased in bit capacity. Besides the five data bits, a start bit, the reversible "flip" bit, and a parity bit may comprise an eight bit data word.

The data selection circuit or parallel to serial converter 301 of FIG. 3 provides the data word in serial form. Referring briefly to FIG. 6, there is shown one and one-half frames of data in serial form. The eight bit data word comprises the start bit of 0 in position 0, five bits of data, the "flip" bit in data bit position 6, and the parity bit in position 7 identifying either odd or even parity of the data bits and "flip" bit.

The flip bit generator 204 provides on lead KI the reversed "flip" bit to be placed in bit position 6. This feature, however, may be implemented in any of the bit positions comprising the data word.

This "flip" bit may or may not be included in the calculation of odd or even parity. In the depicted embodiment, it is assumed that the "flip" bit is included and the bit is provided to parity bit generation circuit 214 along with the five bits of data provided by data latch circuit 202 through the low battery code inhibit circuit 203.

Figure 7:
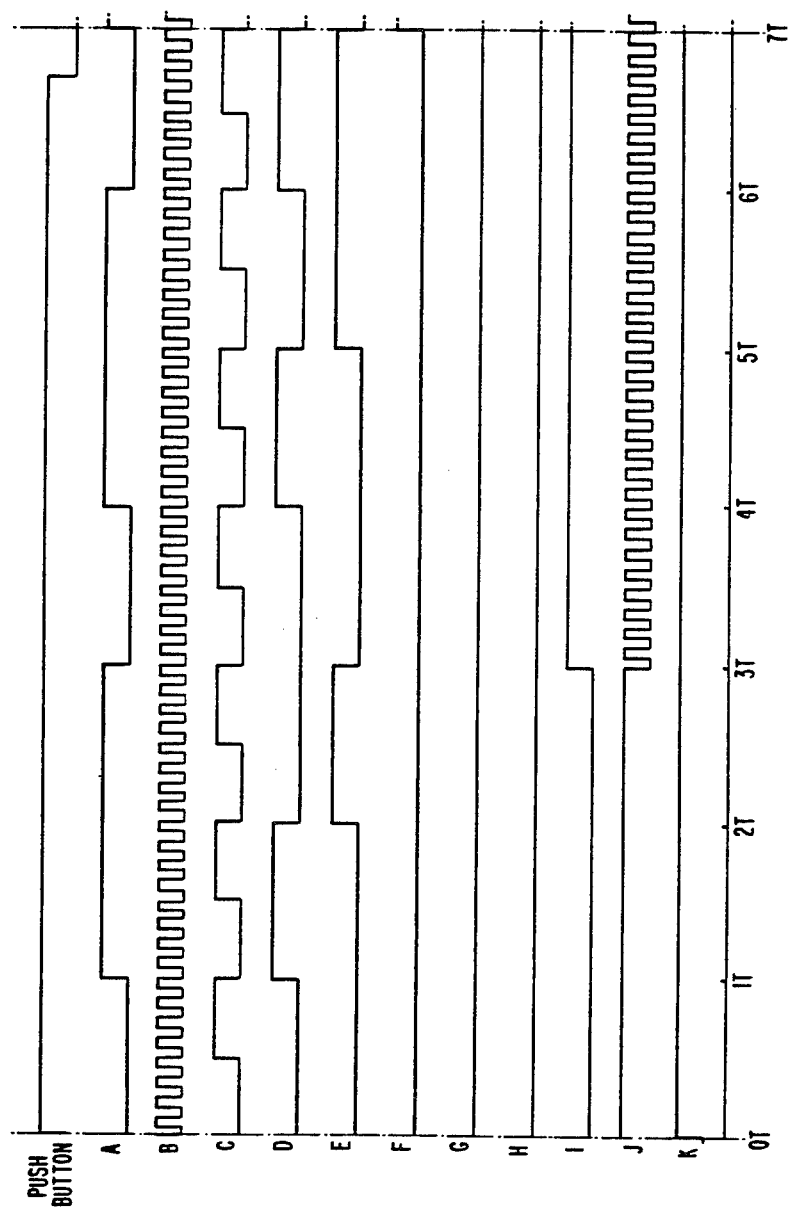

Referring now to FIG. 3, the provision of a modulated data signal, in particular, a frequency shift keyed signal, and other features are now discussed in relation to the timing diagrams depicted in FIGS. 7, 8, and 9 and the serial transmission scheme depicted in FIG. 6.

Parallel to serial converter 301 of FIG. 3 provides a complete data word in serial form to variable modulus counter 302 upon the depression of a button of keyboard 200. Depending upon the state of each bit positioned in the data word, the variable modulus counter 302 either divides a clock frequency by a first modulus M or a second modulus N.

For example, the button representing "increase the volume" of television 100 is pushed which may be represented by the five bit code 11010. The parallel to serial converter 301 may compose a data word in accordance with FIG. 6 of 01101001. The first 0 in the word is a start bit. The next six positions comprise the five positions of code and the "flip" bit of 0. The bit in bit position 7 assuming odd parity and including the "flip" bit in the parity calculation is a 1.

Accordingly, variable modulus counter 302 divides the clock frequency by M upon receipt of the 0 start bit, by N upon receipt of the first two bits of data, by M upon the receipt of the third bit of data and so on.

In one embodiment, the clock frequency is 50 kHz, M is 8 and N is 10. Upon receipt of a 0, a 6.25 kHz signal is generated. Upon receipt of a 1, a 5 kHz signal is generated. Accordingly, a frequency shift key modulated data signal results which comprises time slots of binary data indicated by a particular frequency.

While other frequencies may be employed, the principles of the depicted embodiment require that the data frequencies are selected above the bandwidth of the human voice so that the voice and data may be simply summed before modulation and transmission. Otherwise, the complexity of the transmitter and receiver circuitry would be greatly increased.

Variable modulus counter 303, responsive to the serial output A of the parallel to serial converter 301, divides the frequency shift key modulated data output B by N or M in opposition to the operation of the first variable modulus counter 302. In the particularly described embodiment, a 5.25 kHz signal is always divided by 10 and a 5 kHz signal by 8. The result is a 625 Hz signal. This signal is an appropriate bit rate in accordance with the rate of data input from manually operated keyboard 200.

Data bit counter 304 counts the bits as the data is acted upon by the variable modulus counters. In the particularly described embodiment, a data word comprises eight bits. Accordingly, data bit counter 304 counts to binary eight, indicated by control signals D, E and F. Control signals D, E, and F, representing binary 8, are provided to the parallel to serial converter 301. Control signal F alone is provided to marker/data counter 305.

There is a problem in that normal transmission of marker at the beginning and end of a string of data words may result in a loss of information transfer to the receiver. Also, since data transmission is user activated and not continuous, synchronization of the receiver for data demodulation must precede every data transmission. Marker, which may be a series of eight 1 data bits, precedes every data word to ensure this synchronization in the receiver.

Referring briefly to FIG. 6, there is shown a serial transmission scheme which resolves this problem. Eight bits of marker data, comprising one word, is inserted before each data word of eight bits. The marker word and the data word together comprise one frame of data.

Marker/data counter 305, responsive to the control signal output F of the data bit counter 304, divides control signal output F by two resulting in inhibit signal G. Data inhibit signal G, provided to variable modulus counter 302, inhibits data flow so that marker may precede data.

Frame counter 306, responsive to the marker control output G of the marker/data counter 305, provides an indication of the number of frames of marker and data words transmitted. The frame counter 306 serves two functions. Firstly, it is desirable to transmit at least two frames of data for data accuracy. Data is transmitted for at least two frames requiring 51.2 milliseconds even though a keyboard button may be depressed for as short a time as ten milliseconds. In the two frames, the "flip" bit and the parity bit change. As previously described, the receiver is thereby assisted in distinguishing between a break in transmission and a multiple transmission of the same data word. Secondly, it is desirable to count the number of frames of "on" or "off" codes in the turn on and turn off sequences. Accordingly, a frame counter control signal H, as previously described, is provided to on/off control circuit 215 of FIG. 2.

At the same time that data encoder 201 provides low battery logic circuit 213 with a signal indicating the presence of data for transmission, that signal is also provided to counter control and logic clearing circuit 312. The counter control and logic clearing circuit serves several functions.

It provides data control signal K to activate microphone muting switch 405 and FSK gain switch 406 shown in FIG. 4. As a result voice is preempted in the presence of data for transmission. It also maintains surveillance of the states of the various counters, including counters 302, 303, 304, 305 and 306 and is able to clear the counters for a new data stream or during transmitter turn on. Responsive to the control signal from data encoder 201, the counter control circuit 312 controls the operation of carrier control circuit 217 and data latch 202. In order to permit the receiver time to prepare for the reception of data after carrier transmission is initiated, the counter control circuit 312 provides control signal I for delaying the transmission of FSK data signal B.

Referring now to FIG. 4, the voice input, data preemption, and modulation circuitry are shown. In the voice mode of use, the voice preemphasis circuit 403 and the associated transmission and modulation circuits 404, 408, 409, and 410 are supplied power. When no data control signal K is present, voice or other signals provided through microphone 402 are preemphasized at preemphasis amplifier circuit 403. The preemphasized voice signal passes through summation circuit 401 and is soft-clipped at limiter circuit 404. The output of limiter circuit 404 is modulated by modulator 408 to a particular carrier frequency which should be selected to be much greater than the highest modulated data frequency. The output of the modulator 408 is passed through a square wave to sine wave converter 409 and is provided to operate infrared driver amplifier 410 and optical transmission circuit 411 for providing infrared light waves 2.

In the presence of data, however, the voice input is preempted as follows. The data control signal K activates microphone muting switch 405 which may highly attenuate or squelch altogether the voice input signal. The FSK modulated data signal J is summed at summation circuit 401 with the remaining voice signal.

In order to prevent over-modulation of the data signal, the FSK gain switch 406, responsive to the data control signal K, attenuates the output of the limiter circuit 404 through attenuation circuit 407. Modulation and infrared transmission proceed in the same manner as is practiced in the transmission of a voice signal alone.

Referring now to FIGS. 7, 8, and 9 which are timing diagrams illustrating the operation of FIG.'S 2, 3, and 4, it is useful to assume that the transmitter is on and a button of keyboard 200 has been depressed, for example, the button representing "increase the volume" of television 100. The code to be initially transmitted for that button may be 01101001, of which data 11010 represents "increase the volume."

FIGS. 7, 8, and 9 show waveforms at various points in the transmitter circuit over a duration of twenty-one time periods of 1.6 milliseconds each after the keyboard button is depressed. Referring briefly to FIG. 10, a key figure, FIGS. 7, 8, and 9 should be placed side by side so that the waveforms representing a button push and waveforms labeled A-K appear to continue from left to right in increasing time periods from 0T to 21T.

At 0T, the button of keyboard 200 of FIG. 2 is depressed, data encoder 201 immediately responds by loading data latch 202 with the particular code for "increase the volume," 11010.

Whether the battery power level has just fallen below acceptable levels or not, because data is now present for transmission, the low battery code inhibit circuit 203 inhibits the provision of low battery code and the five bit code is provided to parallel to serial converter 301 and parity generator circuit 214.

Meanwhile, the KI signal is preestablished to be a 0 in the initial transmission of a data word. Accordingly, the KI signal is simultaneously loaded into the sixth bit position by parallel to serial converter 301 and provided to parity generation circuit 214 of FIG. 2.

Assuming odd parity, parity generation circuit 214, responsive to the KI signal and the five bit code, selects a parity bit, in this example, of 1. Parallel to serial converter 301 loads the parity bit into the seventh bit position, inserts a start bit of 0 in position 0, and is now prepared to provide serial data signal A to variable modulus counter 302. Referring to FIG. 7, serial data signal A is shown between 0T and 3T providing 011, the beginning of the code word.

Simultaneously with the button push, counter control and logic clearing circuit 312 provides data control signal K to operate microphone muting switch 405 and FSK gain switch 407.

Carrier control circuit 217 initiates the transmission of carrier at 0T. In the voice mode, carrier is continuously transmitted. After 3T, an arbitrary time period to allow the receiver to respond to the receipt of carrier in the data mode, control signal I is provided to AND gate 307 and FSK output data signal J is initiated. Variable modulus counter 302, meanwhile, is in receipt of a data inhibit signal G provided through OR gate 313.

Data inhibit signal G causes counter 302 to initially provide marker data for comprising signal B. Accordingly, despite the presence of data signal A, the FSK modulated data signal output B represents a string of 1 marker bits at 5 kHz, the 50 kHz clock frequency output of clock 308 divided by N or 10.

Variable modulus counter 303 recognizing that a stream of 1 bits is being acted upon by variable modulus counter 302 divides FSK modulated data signal B by M or N. Accordingly, bit rate signal C is provided at 625 Hz.

Bit rate signal C is provided to data bit counter 304 for counting the bits as they are transmitted. Output signals D, E, and F form a binary bit counter. For example, signals F, E, and D at 0T-1T read 000, at 1T-2T read 001, and at 2T-3T read 010. Once the arbitrary time period 0T-3T is complete, the receiver is prepared to receive data. Counter control circuit 312 resets data bit counter 304, and output signals D, E, and F begin again to count bits. At the same time, control signal I, as previously mentioned, begins the flow of marker data signal J.

From 3T, shown in FIG. 7, to 11T, shown in FIG. 8, the F, E, and D signals show a counting of data bits from 000 through 111. Data signal A indicates the code sequence 01101001. Because signal G, however, is low, data is inhibited and marker signal B is provided as the FSK modulated output signal J.

Data bit counter 304 output signal F, which indicates when four bits are transmitted is provided to marker data counter 305. At 11T, output signal G, signal F divided by two, of marker/data counter 305 now goes high indicating the transmittal of the eight marker bits. The output signal G is provided to variable modulus counter 302 to disable the inhibit of data.

Between 11T and 12T, a binary 0 start bit from signal A is transmitted. The clock frequency is divided by 8 resulting in a 6.25 kHz square wave signal B between 11T and 12T. As signal I is still high, this signal also becomes FSK modulated data output signal J. Counter 303, responsive to a 0, divides the 6.25 kHz signal by 10 resulting in the same bit rate square wave C.

The five bit code word 11010 follows the start bit, forming FSK modulated data output signal J. Lastly, flip bit 0 and parity bit 1 complete the initial eight bit data word at 18T and 19T respectively, shown in FIG. 9.

The button is released at between 6T and 7T, shown in FIG. 7. It is known generally that a button may be depressed and released as quickly as ten milliseconds. On the other hand, the button may be held in a depressed state far longer. Accordingly, consideration of two factors becomes relevant; the anticipated bit rate of input from a transmitter user and, on the other hand, the desirability of providing secure and reliable data transmission.

In the particular discussed embodiment, the bit rate of 625 Hz represents a normal expected bit rate for a user operable keyboard. Additionally, despite the potentially short button push of ten milliseconds, at least two frames of a data word, requiring about 50 milliseconds, are transmitted. In other embodiments, these factors may be weighed differently resulting in different allocations of marker data, a data word of a different length or other design changes known in the art.

Marker/data counter 305 output signal G is provided to frame counter 306 which assures that a particular number of frames of data or a sequence of frames of data for on/off codes is transmitted. At 19T, output signal H of frame counter 306 goes high for the first time indicating that one complete frame of marker and data words has been transmitted.

After 19T, marker/data counter 305 output signal G goes low again inhibiting the flow of data. Signals B and J after 19T again represent the flow of marker. At 27T, not shown, a new data word is transmitted comprising the same information in bit positions 0-5, but a "flip" bit of 1 in bit position 6, and a parity bit of 0 in bit position 7.

In the event that the user continues to depress the button after two frames of data are transmitted, data transmission may continue until the button is released. On the other hand, after a quick button release, data transmission should continue until a complete data word has been transmitted and marker is about to begin again.

What is claimed is:

1. A frequency shift keyed signal generator circuit characterized by
    a first variable modulus counter (302) for dividing a clock frequency by a particular first or second modulus (M or N), an applied input (A) being a binary zero or one data signal respectively, the output being a frequency shift keyed signal (B),
    a second variable modulus counter (303), responsive to the applied input signal (A) and the frequency shift keyed output signal (B) of the first variable modulus counter (302), for dividing the frequency shift keyed output signal by the predetermined second or first modulus (N or M), the output (C) being at the bit rate of the applied input signal (A), and
    a data bit counter (304), responsive to the output of the second variable modulus counter (303), for dividing the output of the second variable modulus counter by a particular binary quantity of data bits.

2. A frequency shift keyed signal generator circuit characterized by
    means (302) for dividing a clock frequency by a particular first or second modulus (M or N), an applied input (A) being a binary zero or one data signal respectively, the output being a frequency shift keyed signal (B),
    means (303), responsive to the applied input signal (A) and the frequency shift keyed signal (B), for dividing the frequency shift keyed signal by the predetermined second or first modulus (N or M), the output (C) being at the bit rate of the applied input signal (A), and
    means (304), responsive to the output (C) of the second variable modulus counter (303), for dividing the output of the second variable modulus counter by a particular binary quantity of data bits.

3. A frequency shift keyed signal generator circuit as recited in claim 1 or 2
    further characterized by
    a data selector circuit (301), for inserting a flip bit in the applied binary data input (A), the flip bit for assisting a receive terminal to distinguish between a break in data transmission and a multiple transmission of the same data.

4. A frequency shift keyed signal generator circuit as recited in claim 3
    further characterized in that
    the data selector circuit (301) additionally inserts a parity bit, dependent on the flip bit, in the applied binary data input (A).

5. A frequency shift keyed signal generator circuit as recited in claim 1
    further characterized by
    a low battery indicating circuit (203, 212, 213, 301), responsive to a control signal indicating a low battery condition, for inserting a particular code for the low battery condition in the applied binary data input.

6. A frequency shift keyed signal generator circuit as recited in claim 5
    further characterized in that
    the low battery indicating circuit comprises a low battery code inhibit circuit (203), responsive to a data signal, for inhibiting the insertion of the particular low battery code in the presence of the data signal.

7. A frequency shift keyed signal generator circuit as recited in claim 1
    further characterized by
    a data selector circuit (301) for inserting a flip bit having a particular periodic location in the applied binary data input (A).

8. A frequency shift keyed signal generator circuit as recited in claim 1
    further characterized by a marker data counter (305), responsive to the data bit counter (304), for providing a control signal (G) to the first variable modulus counter (302), the control signal regulating the provision of marker data.

9. A frequency shift keyed signal generator circuit as recited in claim 8
further characterized by
a frame counter (306), responsive to the marker/data counter.

* * * * *

UNITED STATES PATENT AND TRADEMARK OFFICE
CERTIFICATE OF CORRECTION

PATENT NO. : 4,461,013
DATED : July 17, 1984
INVENTOR(S) : Gregory Lese, Donald H. Nash It is certified that error appears in the above—identified patent and that said Letters Patent is hereby corrected as shown below:

In the Detailed Description, Column 6, line 25, "5.25" should read --6.25--.

Signed and Sealed this

Ninth Day of April 1985

[SEAL]

Attest:

DONALD J. QUIGG

*Attesting Officer*   *Acting Commissioner of Patents and Trademarks*